US007066758B2

(12) United States Patent

Schwarz et al.

(10) Patent No.: US 7,066,758 B2

(45) Date of Patent: Jun. 27, 2006

(54) ELECTRICAL SOCKET

(75) Inventors: Gerhard Schwarz, Schoenbrunn-Allemuehl (DE); Rainer Naumann, Mannheim (DE)

(73) Assignee: Cooper Crouse-Hinds GmbH (DE)

( * ) Notice: Subject to any disclaimer, the term of this patent is extended or adjusted under 35 U.S.C. 154(b) by 0 days.

(21) Appl. No.: 11/041,880

(22) Filed: Jan. 25, 2005

(65) Prior Publication Data

US 2005/0181657 A1 Aug. 18, 2005

Related U.S. Application Data

(63) Continuation-in-part of application No. 10/069,760, filed as application No. PCT/EP00/04697 on May 31, 2000, now abandoned, said application No. 11/041,880 is a continuation-in-part of application No. 10/450,959, filed as application No. PCT/EP01/14923 on Dec. 18, 2001, now abandoned.

(30) Foreign Application Priority Data

Aug. 31, 1999 (DE) .......................... 299 15 263 U
Dec. 18, 2000 (DE) .......................... 200 21 374 U

(51) Int. Cl.
*H01R 4/50* (2006.01)

(52) U.S. Cl. .................................. 439/333; 200/50.28

(58) Field of Classification Search ................ 439/333, 439/332, 318, 188; 200/50.28, 50.29, 50.3, 200/50.31, 51.51 R, 51.09, 51.11, 51.12
See application file for complete search history.

(56) References Cited

U.S. PATENT DOCUMENTS 3,023,394 A * 2/1962 Hubbell ...................... 439/337
3,525,068 A * 8/1970 Nelson ...................... 439/138
3,789,346 A 1/1974 DeBrick
3,808,579 A 4/1974 Mina et al.
3,853,376 A * 12/1974 Marechal .................... 439/139
4,193,655 A 3/1980 Herman, Jr.
4,198,110 A 4/1980 Wetmore et al.
4,772,215 A 9/1988 Falk
5,386,486 A 1/1995 Fan et al.
5,417,594 A * 5/1995 Herman et al. ............. 439/690
5,423,692 A * 6/1995 Francis ...................... 439/335
5,697,798 A * 12/1997 Marechal .................... 439/139
6,162,082 A * 12/2000 Karsten et al. ............. 439/318
6,206,714 B1 * 3/2001 Bernardini .................. 439/335

(Continued)

FOREIGN PATENT DOCUMENTS

CH 311 948 12/1955

(Continued)

*Primary Examiner*—Tulsidas C. Patel
*Assistant Examiner*—Phuongchi Nguyen
(74) *Attorney, Agent, or Firm*—Fish & Richardson P.C.

(57) ABSTRACT

An electrical socket, in particular for explosion-prone areas, includes a socket insert, which is supported in a socket housing such that it is adapted to be rotated between off- and on-positions and in which a substantially pin-shaped locking element is supported such that it is displaceable between a pressed-down blocking position and a release position in which it projects beyond the socket insert. In the release position of the locking element, the socket insert is rotatable between the off- and on-positions. In order to improve an electrical socket of this type in such a way that it can also be connected to other plugs on certain occasions, the substantially pin-shaped locking element is defined by at least one removable locking component and a blocking component, which are arranged on top of one another in the socket insert, with the locking component projecting beyond the socket insert in the release position.

16 Claims, 8 Drawing Sheets

U.S. PATENT DOCUMENTS 6,382,990 B1 5/2002 Marechal et al.
6,386,897 B1 * 5/2002 Muller ........................ 439/314

FOREIGN PATENT DOCUMENTS

DE 558 669 9/1932
DE 2 832 105 A1 1/1980
EP 0 151 715 A2 8/1985
FR 1 103 645 11/1955
FR 2 266 332 10/1975
FR 2 734 668 11/1996

* cited by examiner

ELECTRICAL SOCKET

CLAIM OF PRIORITY

This application is a continuation-in-part of U.S. patent application Ser. No. 10/069,760, titled "Electric Plug Connector," filed on Sep. 23, 2002, now abandoned which is a U.S. national stage application, under 35 U.S.C. § 371, of PCT International Application No. PCT/EP00/04697, filed on May 31, 2000, which claims priority to German Patent Application No. DE 299 15 263, filed on Aug. 23, 1999. This application also is a continuation-in-part of U.S. patent application Ser. No. 10/450,959, titled "Electrical Socket," filed on Dec. 8, 2003, which is a U.S. national stage application, under 35 U.S.C. § 371, of PCT International Application No. PCT/EP01/14923, filed on Dec. 18, 2001, which claims priority to German Patent Application No. DE 200 21 374, filed on Dec. 18, 2000. Each of the foregoing applications is incorporated herein by reference in its entirety.

BACKGROUND

An electrical connector can be used to connect a piece of electrical equipment to a source of electrical power. For example, a piece of electrical equipment can have a plug that can be connected to an electrical socket to provide power to the piece of electrical equipment. In areas that are prone to explosion, such as areas where volatile gases are used (also known as an explosion-prone area), inserting a plug into or removing a plug from a live electrical socket can cause an explosion.

SUMMARY

An electric connector particularly suited for use in explosion-prone areas permits voltage free plugging and switching on. In one implementation, the electrical connector includes a plug and a socket. The socket includes at least one housing and a socket insert supported in the housing such that the socket insert is rotatable between off and on positions by the plug being inserted in the socket. A differentiation with respect to different types of currents, voltages, frequencies or the like is made possible by a suitable arrangement of contact pins within the plug.

In one aspect, the socket insert includes a locking element with at least one coding projection. A spring, or the like, biases the locking element such that the coding projection projects from the socket insert. When a plug that has a complementary coding aperture is inserted into the socket insert, the coding aperture receives the coding projection, such that the locking element is in the release position, which allows the socket insert to be rotated between off- and on-positions. If a plug with a different coding aperture or no coding aperture is inserted into the socket insert, the plug presses the locking element into the socket, such that the locking element is in the blocking position, which prevents rotation of the socket insert from the off-position to the on-position.

The locking element can be supported in the socket insert in a radially displaceable manner. In the case of plugs having no complementary coding aperture, the locking element may prevent a rotation of the socket insert relative to the housing, whereas in the case of plugs having a complementary coding aperture, the locking element may be displaceable radially inwards towards the coding aperture, whereby the socket insert is released for rotation. The locking element can be implemented as a locking pin which is supported in the socket insert such that it is longitudinally displaceable between the locking and release positions essentially in the plug-in direction of the plug.

In order to check, in a visually simple manner, whether the plug and the socket belong together, the locking element may, when occupying the release position, project with one of its ends as a coding projection beyond the socket insert in the direction of the plug. In this way, whether the coding projection and the coding aperture formed in the plug match can be checked visually.

The locking pin may essentially be arranged at an arbitrary position in the socket insert. The locking pin may be arranged essentially centrally in the socket insert so that it need not be arranged in an edge portion of the socket insert or so that the normal arrangement of the electric contacts in the plug and in the socket insert, respectively, will not be hindered.

In order to guarantee also in the case of minor deviations of different coding projections that the electric plug connector can be activated only by a plug having a suitable coding aperture, the coding projection can be implemented such that its cross-section is complementary to the cross-section of the coding aperture.

Reliable guiding of the locking pin between the locking and release positions can be so conceived that, if the socket insert is provided with a longitudinal guide component for the locking pin, the cross-section of the longitudinal guide component is substantially equal to the cross-section of the coding projection. This also means that the cross-section of the locking pin corresponds substantially to that of the coding projection.

Respective reception holes for electric contact pin bushings can be arranged around the longitudinal guide component in the socket insert. The contact pin bushings can be insertable in these reception holes and, if necessary, they can be secured in position therein.

In order to prevent the coding projection of the locking pin from protruding beyond the socket insert more than necessary, the locking pin may project beyond the longitudinal guide component with its lower end located opposite the plug and may be provided with a stop which may be adapted to be brought into contact with a lower end of the longitudinal guide component. The stop can be implemented as upper end of an end sleeve of the locking pin which is open at the bottom, the end sleeve being adapted to accommodate at least part of a spring for applying a force to the locking pin in the direction of the locking-pin release position. In this way, the end sleeve may serve both as a stop and as a means for accommodating the spring.

In order to support and guide at least part of the spring in the end sleeve, a centering pin can be arranged centrally in the end sleeve, at least part of the spring being adapted to be pushed onto the centering pin. In order to rotatably support the socket insert in a simple manner and hold it simultaneously at a position suitable for insertion of the plug, the socket insert can be supported in an annular element at least in the lower end section thereof, the socket insert being adapted to be inserted together with the annular element in a plug housing which is releasably secured to the housing. The annular element may be produced from a friction-reducing material so that the socket insert can be rotated more easily. In addition, the annular element can serve to position the socket insert in the plug housing.

In order to be able to secure the plug housing together with the annular element and the socket insert to the housing of the electric plug connector in a simple manner, the annular element, the socket insert and the plug housing can be flush with one another at their respective lower ends facing the housing and they can project partially into a housing aperture in the housing. In the interior of the housing, the plug connector can be arranged, which can be used for securing, for example, the plug housing to the housing.

The plug housing may be provided with a circumferentially extending edge flange which is adapted to be releasably secured to an edge of the housing aperture, for example, by screws.

The plug housing can be adapted to be releasably connected to a disk-shaped switching component within the housing. The switching component can support the contact pin bushings and include at least one fastening disk and one switching disk which are rotatable relative to one another and disposable at two locking positions. At one locking position, the electric plug connector may be activated, and, at the other locking position, the contact pin bushings may be voltage-free. The fastening disk may be releasably connected to the plug housing, for example, by screws and may be arranged in the housing to be secured against rotation.

In order to prevent rotation of the socket insert for activating the electric plug connector, the fastening disk can be provided with a locking aperture on its front face facing the socket insert. The lower end of the locking pin may be insertable into the locking aperture, whereby the socket insert and the fastening disk are coupled such that they are secured against rotation relative to one another. The locking pin may have a cross-section corresponding to that of the coding projection, with the exception of the end sleeve area, which may be adapted to be pressed into the locking aperture such that it may be secured against rotation relative thereto if a plug is inserted in the socket insert which is not adapted to activate the electric plug connector.

In order to permit a simple displacement of the switching disk relative to the fastening disk, the annular element can be provided with a dog projecting towards the switching component. The dog may extend through a slot guide component in the fastening disk and engage a dog reception component arranged on the switching disk. If, in this connection, the socket insert is rotated by the inserted plug, the annular element and its dog may be rotated as well, whereby a corresponding rotation of the switching disk will take place via the dog reception component.

In order to enhance rotation of the socket insert for activating the electric plug connector after insertion of the plug in the socket insert, the annular element may have a substantially L-shaped guide slot for an arresting insert, which may be supported on the outer circumference of the socket insert in a longitudinally displaceable manner. The arresting insert may be adapted to be moved along the vertical L-leg by a plug collar of the plug, when the plug is being inserted in the socket insert, and subsequently along the horizontal L-leg by rotating the socket insert relative to the annular element. As long as the arresting insert is still arranged in the vertical L-leg in this connection, the socket insert can be rotated relative to the plug housing.

In order to prevent relative rotation between the socket insert and the plug housing until the plug has been fully inserted, the arresting insert may be provided with an arresting projection which projects radially outwards relative to the socket insert and which may be adapted to be brought into contact with edges of the guide slot. By engaging a complementary reception component in an inner wall of the plug housing, the arresting insert simultaneously guarantees that a relative rotation between the socket insert and the plug housing may not be possible until the horizontal L-leg of the guide slot has been reached. A rotation of the socket insert relative to the plug housing can only take place when the horizontal L-leg has been reached and when the arresting projection has come into contact with an edge at the end of the horizontal L-leg, with a joint rotation of the socket insert and of the annular element taking place. When this joint rotation is taking place, the switching disk may be rotated by the dog of the annular element so as to activate the electric plug connector.

In order to support the arresting insert in the socket insert, the arresting insert can be supported in at least one support pocket such that it is displaceable in the longitudinal direction of the socket insert. The support pocket may be arranged on the lower end section of the socket insert. In order to return the arresting insert to the vertical L-leg when the plug is being re-moved, a spring for applying a force to the arresting insert in the direction of the plug can be arranged between the arresting insert and the base of the support pocket.

In order to be able to correctly associate the socket insert with the contact pin bushings when the electric plug connector is being assembled and in order to permit simultaneously an insertion of the arresting insert at the location in question, a plurality of support pockets can be arranged along the circumference of the socket insert. The support pockets may be arranged in juxtaposition to provide a plurality of possibilities of arranging the arresting insert.

The coding projection may have a semicircular, divided circular, circular, bident, trident, multident or angular cross-section. The coding aperture in the plug may have a complementary shape. The rest of the locking pin may also have such a cross-section down to the end sleeve arranged on the lower end thereof. In one particular implementation, the coding projection may have a semicircular cross-section, whereas the rest of the locking pin has a trident cross-section, and, if desired, the lower end of the locking pin, which is adapted to be inserted into the locking aperture of the locking disk, may have still another cross-section. Further combinations of cross-sections of identical or different shapes are possible.

In order to simplify the assembly of the electric plug connector and in order to rotatably support the socket insert at the same time, the fastening disk can be provided with a guide wall projecting in the direction of the socket insert and engaging an annular groove in the lower end of the socket insert so as to rotatably support the same.

In order to convert the rotational displacement of the switching disk caused by the dog of the annular element during rotation of the socket insert so as to activate the plug connector or so as to switch it to a voltage-free state, the switching-disk back, which is located opposite the fastening disk, may have provided thereon at least one trip cam, which, in response to a rotational displacement of the, switching disk by the dog, may adjust a switching component of an interrupter switch arranged in the housing to a connection position or to an interrupt position.

In another aspect, an electrical socket of the type described above is modified such that the electrical socket can also be connected to other plugs on certain occasions. To this end, the substantially pin-shaped locking element includes at least one removable locking component and a blocking component that are arranged on top of one another in the socket insert, with the locking component projecting beyond the socket insert in the release position. When the locking component is inserted into the socket insert, the electrical socket can only be turned on by using a plug with a corresponding coded aperture, as described above. If the locking component is, removed from the socket insert, only the blocking component is left in the socket insert and the locking component does not project beyond the socket insert. Thus, a suitable coded aperture in a plug will not be necessary to turn on the socket. This means that any commercially available industrial plug, which can be inserted completely in the electrical socket, can be used to rotate the socket insert from its off-position to its on-position when the locking component is removed.

The locking component can be removed, for example, when the device in question, to which the electrical socket is connected, has power supplied thereto for the purpose of repair or the like or in an area which is not explosion-prone. For such repair purposes, a special plug code is not necessary and, in particular; it is not necessary to stock up with plugs for coded different codes and to use these plugs-for connection with the electrical socket. Instead, for purposes of repair, the locking component can be removed and the electrical socket can be used, independently of the code of its locking component, in combination with a commercially available industrial plug.

Since the electrical socket is essentially coded through the locking component, the locking component and the blocking component may have different cross-sections. Only the locking component is arranged such that a respective coding projection thereof is located in an associated coding aperture in the plug. For example, the blocking component may have a circular cross-section, while the locking component has a cross-section which is used for the purpose of coding. Such a cross-section is, for example, a specific angular cross-section, an irregularly shaped cross-section, a cross-section having two arms which extend away from a center, a star-shaped cross-section, or the like. Of course, the arms of the above-mentioned cross-section may be arranged at an angle other than 180° and more than two arms may project from the respective center.

In order to prevent the locking component from falling out of the socket insert, it is also possible to releasably secure the locking component in the socket insert. In this way, the locking component cannot fall out and get lost when the plug has been removed. In addition, the locking component need not be reinserted prior to each insertion of a plug, and instead, will remain in the socket insert after the removal of the plug.

Releasable fastening of the locking component can be executed in different ways. In one simple approach, the locking component can be provided with a lateral longitudinal slot that is adapted to be engaged with a locking pin that is displaceably supported in the socket insert. Other possibilities of releasably fastening the locking component include a suitable locking engagement between the locking component and the socket insert and/or the blocking component or the like. Also, the locking pin can be spring-loaded towards the position of engagement so that it will automatically engage the respective longitudinal slot in the inserted condition of the locking component. The locking pin can be released, for example, by using a tool or a separate device-provided on the socket.

In order to make it more difficult to remove the locking component and in order to permit such removal only with a suitable authorization, the locking pin can be adapted to be locked by a closing cylinder arranged in the socket insert, where a suitable key is necessary to operate the closing cylinder. By this key, the closing cylinder can be rotated between an open position and a closed position, just as in the case of a known lock. In the closed position, the locking pin is in engagement with the longitudinal slot in the locking component so that the locking component cannot be removed from the socket insert. In the open position of the closing cylinder, the locking pin does not engage the longitudinal slot and the locking component can be removed easily.

In order to indicate to every user of the electrical socket that the electrical socket should no longer be used when the locking component is removed, especially not in explosion-prone areas, a warning can be visible when the locking component has been removed. A simple implementation of such a warning is a specific marking of the end of the blocking component facing the locking component, with the marking being visible when the locking component has been removed. The end can be marked, for example, using a suitable warning color.

In order to make the warning more clearly perceptible, it also can be visible on an electrically operated display component. Such a display component is, in the simplest case, a warning lamp that lights up when the locking component has been removed. Such a warning lamp may, for example, light up red when the locking component has been removed. It is also possible that, in the inserted condition of the locking component, an additional lamp lights up green so as to indicate that use of the electrical socket is appropriate even in explosion-prone areas. The display component can also be designed such that a readable warning is displayed, such as "do not use in explosion-prone areas."

The presence or absence of the locking component can be detected electrically. In one simple approach, an electric contact can be closed and the electric display can be switched to be ineffective when the locking component and the blocking component abut on one another. Separate electrical components in the socket insert can be dispensed with in this way, and the electric display component may-be switched on or off directly through the locking component and the blocking component.

In order to establish the electric contact between the locking component and the blocking component in a simple manner, the locking component may have a contact element on its end facing the blocking component, with the contact element interconnecting electric lines provided in or on the blocking component. When the locking component is inserted, the electric lines are interconnected and the electric display component is turned off and does not display any warning. When the locking component has been removed, the electric display component is turned on.

The contact element can be implemented as a short-circuit contact that shorts two electric lines that conduct through the blocking component to the display component. The electric lines are, in this way, short-circuited when the locking component is inserted such that the display component is not supplied with-power.

The details of one or more implementations are set forth in the accompanying drawings and the description below. Other features will be apparent from the description and drawings, and from the claims.

DETAILED DESCRIPTION

Figure 1:
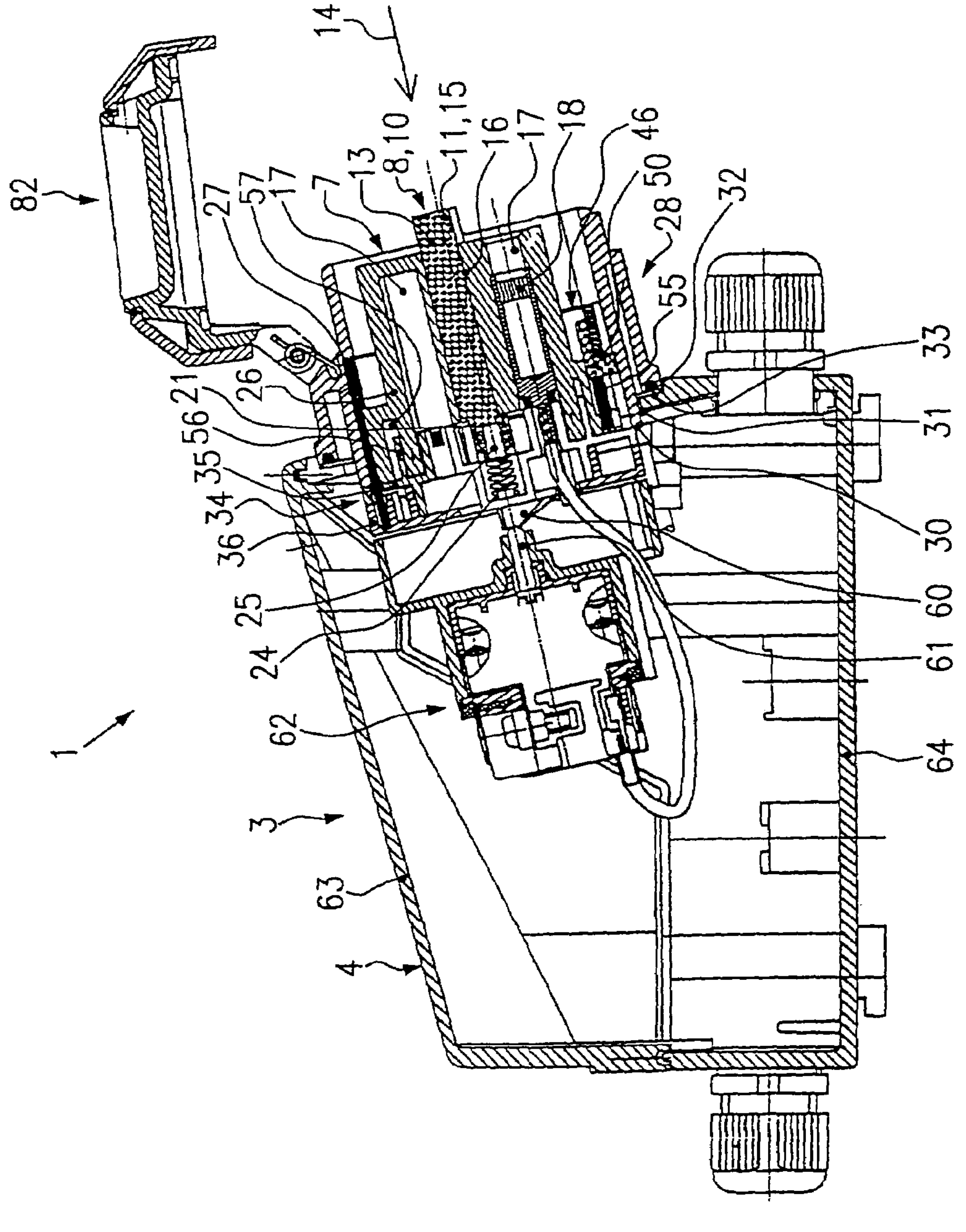
FIG. 1 shows a longitudinal section through one implementation of a socket of a plug connector.

FIG. 1 shows in a longitudinal section a plug connector 1 comprising a socket 3 into which a plug 2, not shown, is insertable from the plug-in direction 14. The socket 3 comprises a housing 4 consisting of an upper housing section 63 and a lower housing section 64. These housing sections are releasably interconnected by a screw-type connection. At the housing end shown on the right hand side in FIG. 1, a housing aperture 31 is arranged. The edge 33 of the housing aperture 31 has releasably secured thereto a plug housing 28 by an edge flange extending circumferentially on the lower end 30 of the plug housing 28. A cover 82 is pivotably supported on the plug housing 28.

The plug housing 28 has arranged therein a socket insert 7 whose lower end section 26 is surrounded by an annular element 27. The plug housing 28, the annular element 27 and the socket insert 7 are arranged such that their lower ends 30, 29 and 58 are flush with one another (see also FIG. 3), and they are inserted through the housing aperture 31 into the housing 4. In the housing 4 a switching component 34 is arranged, which comprises a fastening disk 35 and a switching disk 36. The two disks 35, 36 are arranged concentrically with one another and have the same radius. The fastening disk 35 is adapted to be screw-fastened to the lower end 30 of the plug housing 28 by fastening projections 76 (FIG. 10), which are not shown in FIG. 1. The plug housing 28 and the fastening disk 35 are in this way secured to the housing 4 in such a way that they are secured against rotation relative to one another. The fastening disk 35 is provided with a circularly extending guide wall 56 on its front facing the socket insert 7. The guide wall 56 is inserted into a complementary annular groove 57 on the lower end 58 of the socket insert 7 so as to rotatably support the socket insert 7.

A locking aperture 40 (FIGS. 2 and 10) is arranged centrally in the fastening disk 35. A lower end of a locking pin 13 defining a locking element 8 is insertable into the locking aperture 40. The lower end 19 of the locking pin 13 has arranged thereon an end sleeve 23 which is open in the direction of the locking aperture 40. The end sleeve 23 has centrally arranged therein a centering pin 25 which projects beyond the end sleeve 23 and which has attached thereto part of a spring 24. The spring 24 rests on the bottom of the locking aperture 40 and applies a force to the locking pin 13 in the direction of the locking-pin release position 10 shown in FIG. 1. At this release position, the lower end 19 of the locking pin 13 is arranged outside of the locking aperture 40 so that the socket insert 7 can be rotated relative to the switching component 34.

Figure 3:
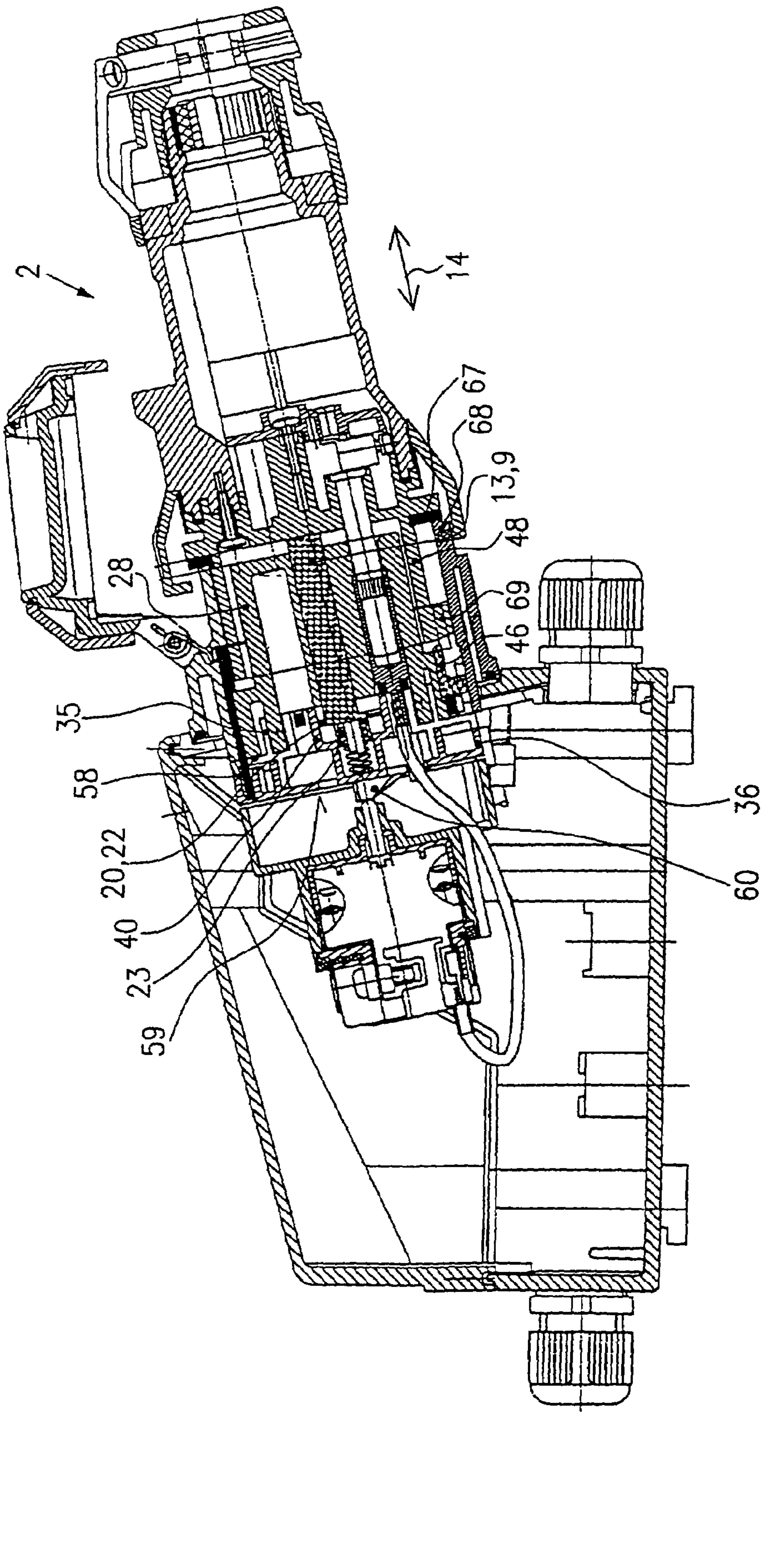
FIG. 3 shows the socket according to FIG. 1 with a plug which is not suitable for activating the electric plug connector.

At least one trip cam 60 is arranged on the back 59 of the switching disk 36, the back 59 being arranged in opposed relationship with the fastening disk 35 (see also FIG. 3). At the locking position 37 at which the switching disk 36 is locked relative to the fastening disk 35 (see also FIG. 10), the trip cam 60 forces a pin-shaped switching component 61 towards an interrupter switch 62, the locking position 37 being shown in FIG. 1. The electric plug connector 1 is thus switched to a voltage-free state by the interrupter switch 62 in which a connection between cables (not shown) extending up to the socket 3 and the plug 2 inserted in the socket 3 is interrupted.

An arresting insert 46 is supported in a longitudinally displaceable manner on the lateral surface of the socket insert 7. In the sectional view according to FIG. 1, this arresting insert 46 is L-shaped. A spring 55 applies a force to the arresting insert 46 in the direction of the plug 2 (FIG. 2).

Figure 10:
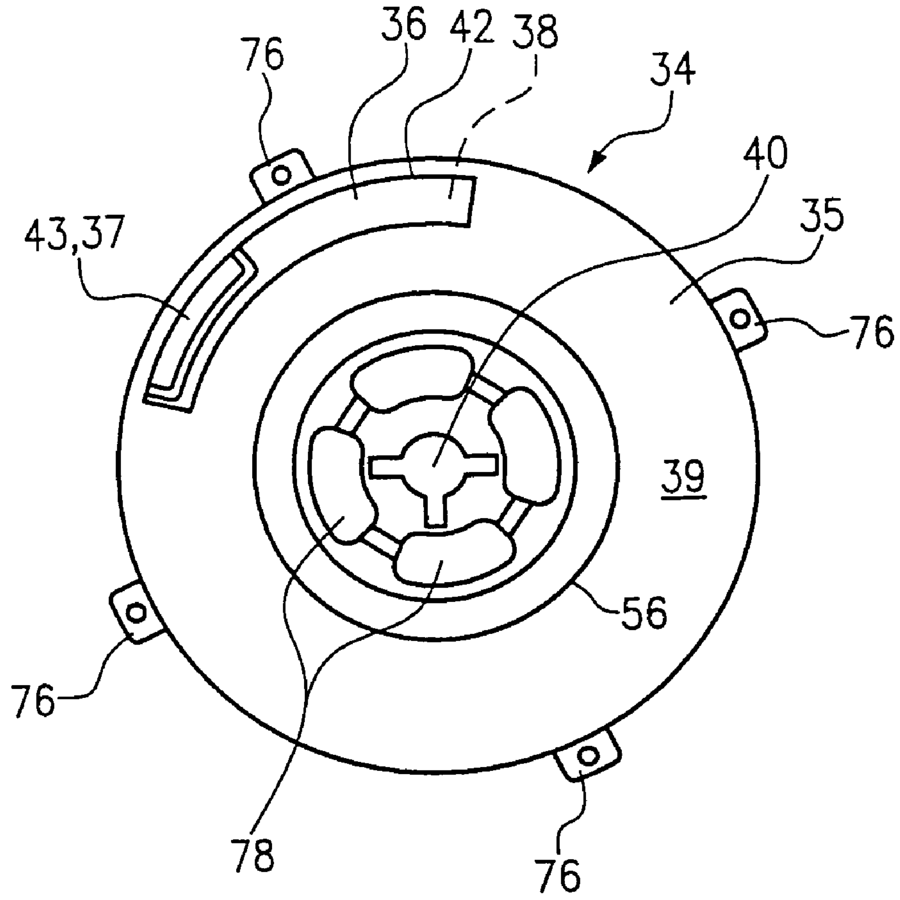
FIG. 10 shows a top view of a switching component comprising a fastening disk and a switching disk.
Figure 11:
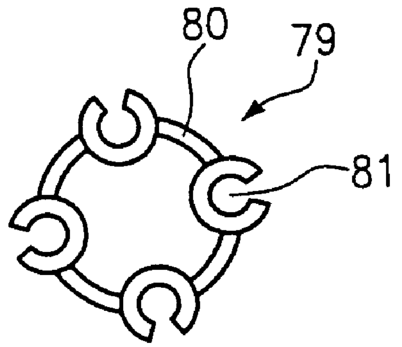
FIG. 11 shows a top view of a rotary-type holder for contact pin bushings.

Three, four or more reception holes 17 are formed in the interior of the socket insert 7, the reception holes 17 having contact pin bushings 18 inserted therein. The contact pin bushings 18 are connected through cables 66 (FIG. 2) to the back of the interrupter switch 62 and they are held by the fastening disk 35 (FIGS. 10 and 11).

Figure 2:
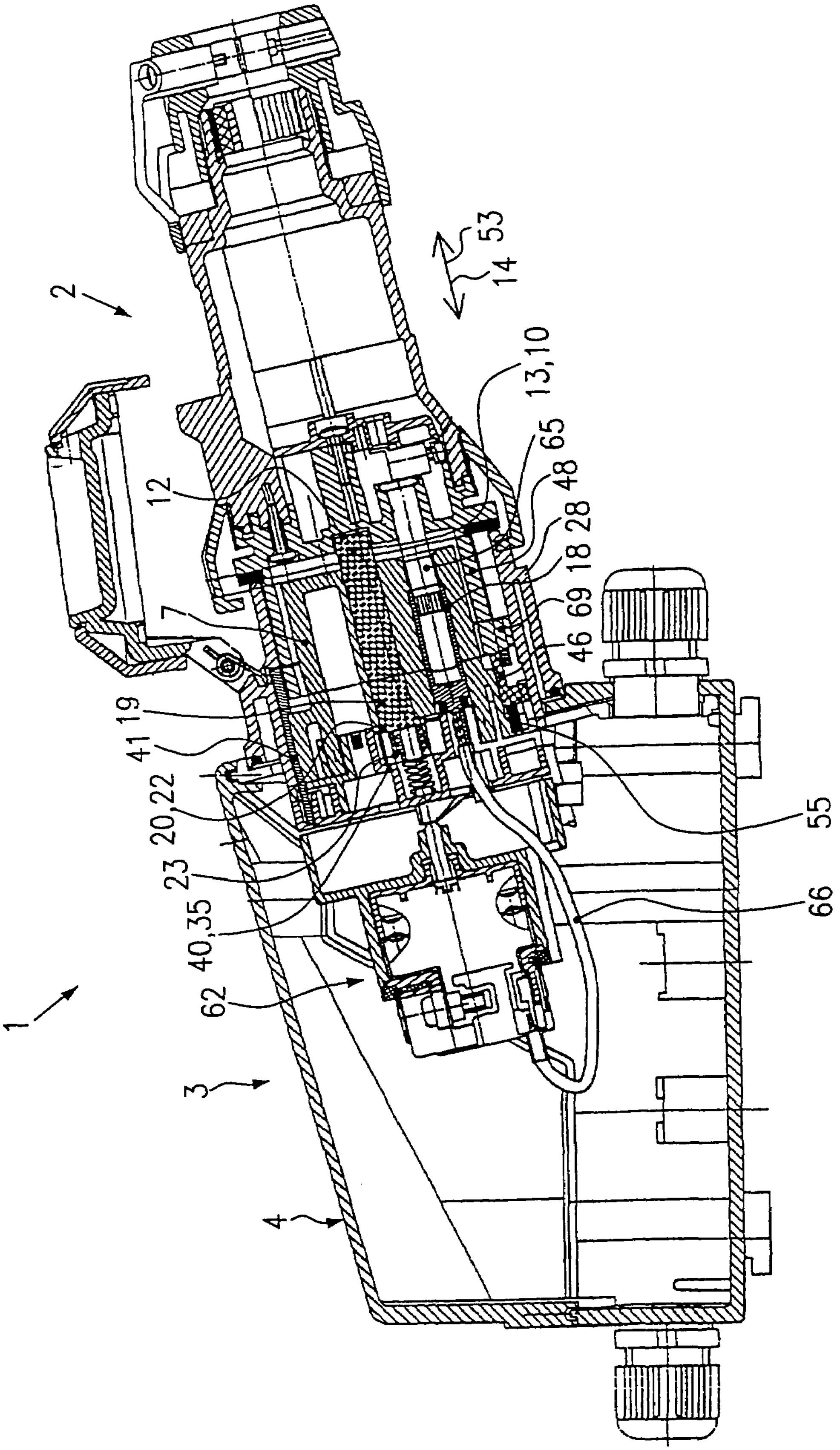
FIG. 2 shows the socket according to FIG. 1 with a plug inserted therein.

The release position 10 of the locking pin 13 is determined by a stop 20 which is defined by an upper end of the end sleeve 23 (see also FIG. 2). The stop 20 abuts on a lower end 21 of a longitudinal guide component 16. The locking pin 13 is displaceably guided in the longitudinal guide component 16.

The locking pin 13 has, especially on the upper end 15 thereof, a coding projection 11 having a specific cross-section. In the embodiment according to FIG. 1, this cross-section does not vary along the whole locking pin 13 up to the lower end 19 thereof. When the locking pin 13 has its lower end 19 inserted in the locking aperture 40 against the force of the spring 24, it is arranged at the locking position 9 (see also FIG. 3).

FIG. 2 shows a section through the socket 3 according to FIG. 1 in a condition in which the plug 2 is inserted. In this figure and also in the following figures, components which are identical with the components shown in FIG. 1 are provided with identical reference numerals and only part of these components is mentioned again. Furthermore, for further describing FIG. 2 and the following figures, reference is additionally made to the description with respect to FIG. 1.

According to the present invention, the end face of the plug is provided with a coding aperture 12 whose cross-section corresponds to the cross-section of the locking pin 13. According to FIG. 2, the end 15 (FIG. 1) of the locking pin 13 is inserted in the coding aperture 12. This has the effect that the locking pin 13 remains in the release position 10 also in the attached condition of the plug 2.

The plug 2 is provided with a plug collar 48 surrounding the socket insert 7 in a sleevelike manner and plugged in between the plug housing 28 and the socket insert 7. The front end of the plug collar 48 has arranged thereon an edge cam 69 which projects radially outwards. The edge cam 69 forces the arresting insert 46 towards the switching component 34 against the force of the spring 55. This has the effect that an arresting projection 50 (e.g. FIGS. 8 and 9) is disengaged from a guide component formed on the inner side of the plug housing 28, whereupon the socket insert 7 with the annular element 27 will be rotatable relative to the plug housing 28. The socket insert 7 is rotated by rotating the plug 2 whose contact pins 65 are inserted in the respective contact pin bushings 18.

Figure 5:
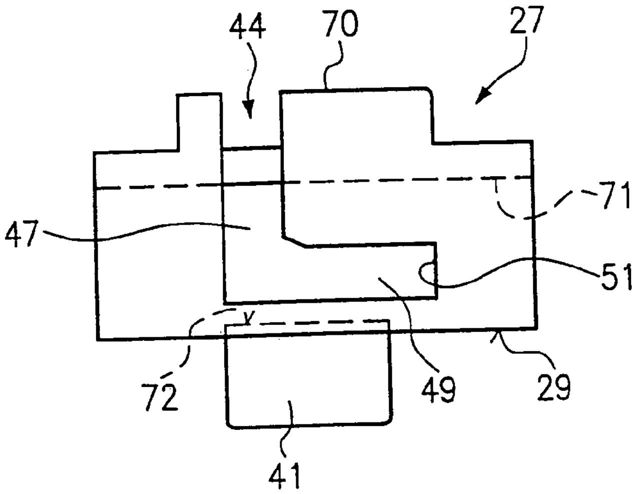
FIG. 5 shows a side view of an annular element.

The rotation of the socket insert 7 and the annular element 27 can be transferred to the switching disk 36 by a dog 41 projecting from the annular element 27 in the direction of the switching component 34 (see also FIG. 5). The switching disk 36 can in this way be switched over between its various locking positions 37, 38 (FIG. 10). At the locking position shown in FIG. 2, the trip cam 60 forces the pin-shaped switching component 61 towards the interrupter switch 62. By rotating the switching disk 36 to the other locking position according to FIG. 10, the trip cam 60 (FIG. 1) is disengaged from the switching component 61, whereby the plug connector 1 is activated, i.e. the electric connection to the plug 2 is established.

FIG. 3 shows a representation analogously to FIG. 2 with a plug 2 having no coding aperture 12. Also in this case, the arresting insert 46 is displaced in the direction of the switching component 34 by edge cams 69 in the inserted condition of the plug 2. The socket insert 7 and the annular element 27 are therefore, in principle, rotatable relative to the plug housing 28, and the locking pin 13 is in its locking position 9 having been displaced by the end face of the plug 2 according to FIG. 3. At this locking position 9, the lower end 19 of the locking pin 13 is inserted in the locking aperture 40 of the fastening disk 35. The socket insert 7 and the fastening disk 35 are in this way coupled such that they are secured against rotation relative to one another so that neither the socket insert 7 nor the annular element 27 with the dog 41 (FIGS. 1 or 2) can be rotated relative to the switching disk 36.

Figure 4:
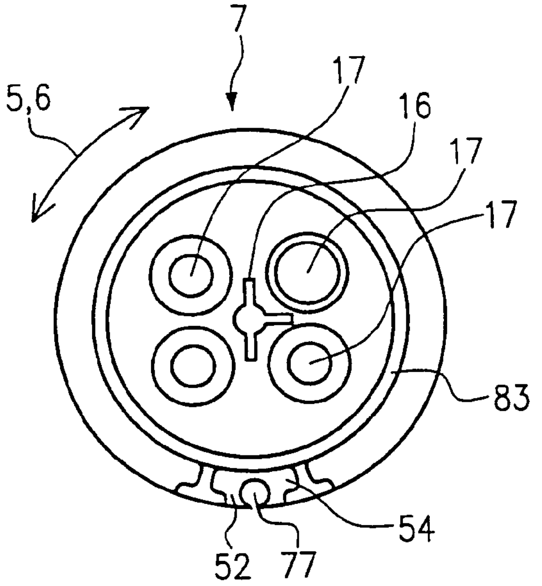
FIG. 4 shows a top view of the socket insert in the condition in which it is arranged in the socket according to FIG. 1.

FIG. 4 shows a front view of the socket insert 7 according to FIG. 1 to 3. This socket insert 7 can be rotatably displaced between an off position 5 an and on position 6 in that it is rotated by the plug (e.g., FIG. 2). When the socket insert 7 is being rotated, the annular element 27 is carried along, as described below, whereby a change-over between the locking positions 37, 38 (FIG. 10) of the switching-disk 36 can be effected by the dog 41 (FIG. 2).

In an end face of the socket insert 7 four reception holes are visible, the reception holes having arranged therein respective contact pin bushings 18 (FIGS. 1–3). The longitudinal guide component 16 is arranged centrally in the end face; in the present embodiment, the longitudinal guide component has a trident cross-section, the three teeth being arranged in a T-shaped configuration and extending from an approximately circular centre.

In the lower end section 26 (e.g. FIG. 1), the socket insert 7 is provided with a shoulder 83 extending radially outwards and including a plurality of support pockets 52, only one of these pockets being shown in FIG. 4. The support pockets 52 are arranged along the circumference of socket insert 7. A hole 77 is arranged in a base 54 of the support pockets 52, the hole 77 having inserted therein a lower end of the spring 55 (FIGS. 1–3). The support pockets 52 define a guide component for the arresting insert 46 (see also FIGS. 8 and 9). The annular element 27 is rotatably supported on the shoulder 83 and on upper ends of the support pockets 52, respectively, by a shoulder 71 formed on the inner side of the annular element 27 (FIG. 5).

Figure 8:
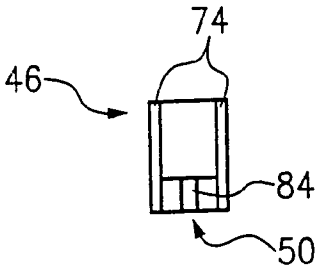
FIG. 8 shows a side view of an arresting insert.
Figure 9:
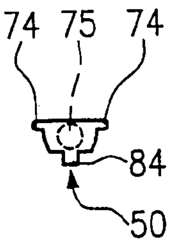
FIG. 9 shows a top view of the arresting insert according to FIG. 8.

FIG. 5 shows a front view of the annular element 27. The inner surface of the annular element 27 is provided with the shoulder 71. The wall of the annular element 27 has formed therein an L-shaped guide slot 44. This guide slot 44 comprises a vertical L-leg 47 and a horizontal L-leg 49 extending at right angles to the first-mentioned L-leg. The vertical L-leg 47 extends in the longitudinal direction 53 (FIG. 2) of the socket insert 7. The arresting insert 46 is guided in the vertical L-leg (FIGS. 8 and 9). After insertion of the plug 2 (e.g. FIGS. 2 and 3), the arresting insert 46 is pressed down along the vertical L-leg 47 in the direction of the dog 41 and can then be displaced relative to the annular element 27 along the horizontal L-leg 49 up to the edge 51 of the guide slot 44 by rotating the socket insert 7.

Opposite to the guide slot 44, the dog 41 projects from the lower end 29 of the annular element 27, a shoulder 72 being formed between the dog 41 and the annular element 27. When the socket insert 7 is inserted in the plug housing 28, this shoulder 72 abuts on the lower end 30 of the plug housing 28.

Figure 6:
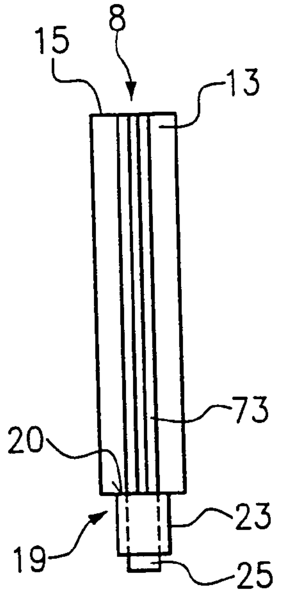
FIG. 6 shows a side view of a locking pin.
Figure 7:
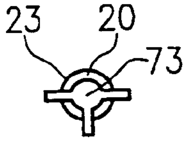
FIG. 7 shows a top view of the locking pin according to FIG. 6.

FIG. 6 shows a front view of the locking pin 13 as locking element 8. In correspondence with the cross-section of the longitudinal guide component 16 (FIG. 4), the locking pin 13 is implemented as a trident pin (FIG. 7). The three teeth are arranged in T-shaped configuration relative to one another and extend from an approximately circular centre. The upper end 15 of the locking pin 13 normally projects beyond the longitudinal guide component 16 of the socket insert 7 in the direction of the plug 2 (FIGS. 1 to 3). The lower end 19 has provided thereon the end sleeve 23 in which the centering pin 25 is centrally arranged. The end sleeve 23 is arranged in the locking aperture 40 (FIGS. 1 and 2), an upper end of the end sleeve 23 defining a stop 20 (see also FIG. 2).

FIG. 7 shows a top view of the locking pin 13 according to FIG. 6. In particular, it can be seen how the three teeth of the cross-section are arranged in a T-shaped configuration around the circular centre 73. The diameter of the end sleeve 23 is larger than a respective diameter of the circular centre 73 so that the stop 20 is defined by the end sleeve 23 projecting radially beyond the circular centre 73.

FIG. 8 shows a front view of the arresting insert 46. The arresting insert 46 is plate-shaped and it has lateral guide projections 74 formed thereon. On the lower end of the arresting insert 46, the arresting projection 50 protrudes, which has an approximately semicircular cross-section provided with a lug 84 that projects radially outwards. This lug 84 constitutes part of the arresting projection 50 and is arranged in a complementary groove on the inner side of the plug housing 28 until the arresting projection 50 is displaced into the horizontal L-leg 49 (FIG. 5) of the annular element 27. The socket insert 7 and the plug housing 28 are in this way coupled such that they are secured against rotation relative to one another.

FIG. 9 shows a top view of the arresting insert 46 according to FIG. 8. The arresting projection 50 has formed therein a hole 75 which is open towards the lower end (FIG. 8) of the arresting insert 46 so as to accommodate a spring 55 (FIGS. 1 to 3).

FIG. 10 shows a top view of the switching component 34 and especially of the fastening disk 35. This fastening disk 35 is circular and provided with four fastening projections 76 protruding from the circumference-of the circle radially outwards. The fastening projections 76 serve to secure the switching component 34 to the lower end 30 of the plug housing 28 by screws (FIGS. 1 to 3).

On a front face 39 of the fastening-disk 35 facing the socket insert 7, the guide wall 56 is arranged, which engages the annular-groove 57 on the lower end 58 of the socket insert 7. The locking aperture 40 is surrounded by the guide wall 56. The cross-section of the locking aperture 40 corresponds to the cross-section of the locking pin 13. It should be pointed out that the diameter of the circular centre of the locking aperture 40 corresponds to the diameter of the end sleeve 23, since the end sleeve 23 is displaceably supported in the circular centre (FIGS. 1 to 3).

The locking aperture 40 is surrounded by four lead-through passages 78 extending after the fashion of elongate holes in a curved configuration around the locking aperture 40. Support webs are arranged between the individual lead-through passages 78, complementary webs 80 (FIG. 11) of a holder 79 being rotatably supported on the support webs. The lead-through passages 78 open into a circular opening of the switching disk 36 and serve as a passage for cables 66 (FIG. 2) having contact pin bushings 18 arranged on the ends thereof. When the socket insert 7 is rotated relative to the annular element 27, of the rotational displacement of the arresting insert 46 along the horizontal L-leg 49, the cables 66 are displaceable along the lead-through passage 78 in a corresponding manner.

The front face 39 of the fastening disk 35 has formed therein a curved slot guide component 42 through which the switching disk 36 can be seen. The latter is provided with a dog reception component 43 into which the dog 41 (FIGS. 1 to 3) of the annular element 27 can be inserted. By rotating the annular element 27 with its dog 41, the switching disk 36 can be displaced between locking positions 37 and 38 with the aid of the dog reception component 43.

FIG. 11 shows a top view of the holder 79. The webs 80 of the holder 79 are rotatably supported on the connection webs between the lead-through passages 78 (FIG. 10). For holding the lower ends of the contact pin bushings 18 (FIGS. 1 to 3), the holder 79 is provided with support eyes 81 having a passage slot which opens radially outwards. The lower ends of the contact pin bushings 18 are adapted to be inserted into the support eyes 81 through the passage slot and, subsequently, these lower ends rest on top of the support eyes.

FIGS. 12A to 14B show three different embodiments for plugs 2 and sockets 3 with different codings of the locking pin 13 or the coding projection 11 and of the coding aperture 12.

Figure 12A:
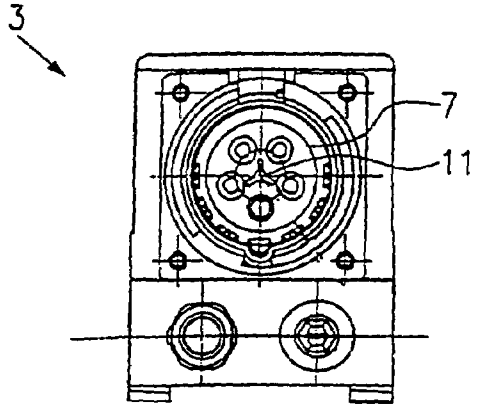
FIGS. 12A–14B show front views of-other implementations of matching sockets and plugs.
Figure 12B:
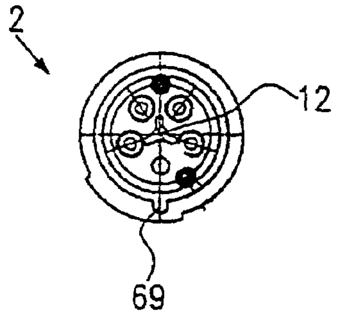

In FIGS. 12A and 12B, the coding takes place by the trident cross-section of the coding projection 11, the three individual teeth being arranged at angles of 120° relative to one another. The coding aperture 12 is implemented in a complementary manner.

Figure 13A:
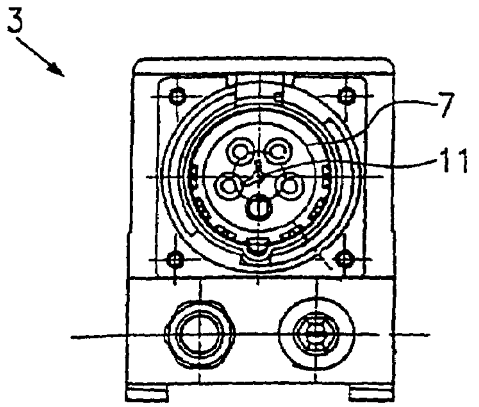
Figure 13B:
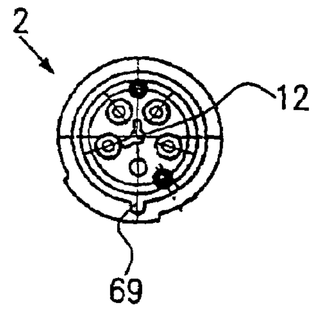

In FIGS. 13A and 13B, the coding takes place by a bident coding projection, the two individual teeth en-closing an angle of approx. 120°. This applies analogously to the coding aperture 12.

Figure 14A:
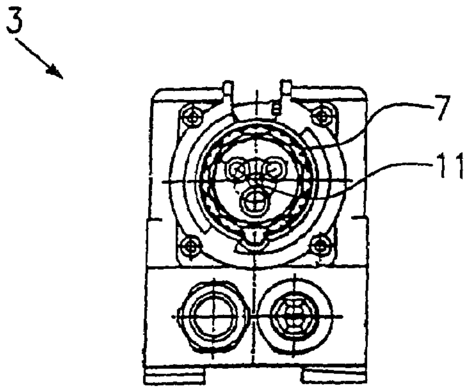
Figure 14B:
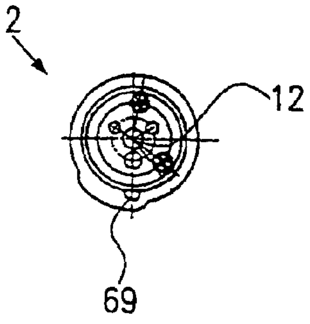

In FIGS. 14A and 14B, the coding projection is circular, as is the coding aperture 12.

In the following, the mode of operation of the plug connector according to the present invention will be explained briefly on the basis of the figures.

In particular in explosion-prone areas, a voltage-free connection is established between the plug and the socket, the respective electric plug connector being activated, i.e. the voltage switched through to the plug 2, only after the connection of these two components.

In FIG. 3, a plug 2 which is not compatible, with the socket 3 has been inserted, the plug being, however, compatible as far as the contact pins and the like are concerned. Due to the fact that a suitable coding aperture 12 does not exist, the locking pin 13 is displaced to its locking position 9 when the plug 2 is attached to the socket insert 7. At this position, the lower end 19 of the locking pin 13 is inserted in the locking aperture 40 of the fastening disk 35. The locking aperture 40 and the locking pin 13 have complementary cross-sections which permit the fastening disk 35 and the socket insert 7 to be coupled such that they are secured against rotation relative to one another.

Normally, the socket insert 7 is adapted to be rotated together with the annular element 27 relative to the plug housing 28 by pressing down the arresting insert 46 by edge cams 69 of the plug 2. However, due to the fact that the engagement of the locking pin 13 with the locking aperture 40 prevents a rotation of the socket insert 7 relative to the switching component 34, the trip cam 60 cannot be disengaged-from the pin-shaped switching component 61 of the interrupter switch 62 by rotating the switching disk 36 to a different locking position. The socket insert is therefore still maintained in a voltage-free state by the interrupter switch 62.

In contrast to the above, the plug 2 according to FIG. 2 shows in the end face thereof a coding aperture 12 whose cross-section is complementary to the coding projection 11 of the locking pin 13. The locking pin 13 is therefore still arranged in its release position 10 even when the plug 2 has been attached to the socket insert 7. At this release position, only the end sleeve 23 of the locking pin 13 is arranged in the locking aperture 40 so that the socket insert 7 and the annular element 27 can be rotated relative to the fastening disk 35 for displacing the switching disk 36 by the dog 41. In the case of such a rotation also the trip cam 60 is rotated relative to the pin-shaped switching component 61, which has the effect that the switching component 61 moves out of the interrupter switch 62 and that the interrupter switch supplies voltage to the socket insert 7.

Figure 15:
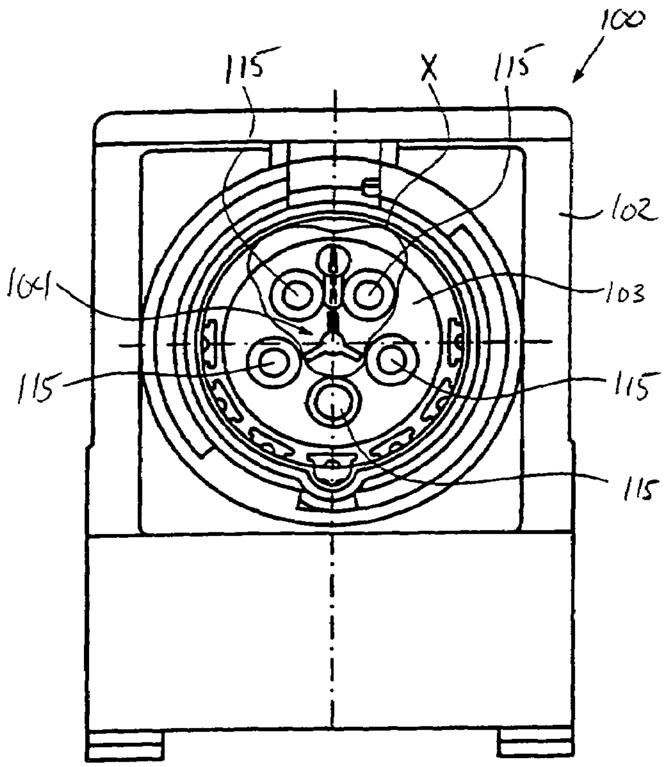
FIG. 15 shows a front view of another implementation of a socket for use with a locking component and a blocking component.

FIG. 15 shows a front view of another implementation of an electrical socket 100 that includes a socket housing 102 having an approximately rectangular cross-section. In the upper part of the socket housing, a socket insert 103 is supported such that it is rotatable between on- and off-positions of the socket. In the illustrated implementation, five contact bushings 115 can be seen in the socket insert 103. Respective contact pins of a plug, which is not shown, are adapted to be inserted into these contact bushings. A locking element 104 is arranged centrally between the contact bushings 115. This locking element 104 is substantially pin-shaped and it is supported in a suitable hole in the socket insert such that it is displaceable between a blocking position and a release position, in the same way as described above with respect to locking pin 13. Thus, in the release position, the locking element 104 projects beyond the socket insert 103 (i.e., out of the plane of the paper) and is, if at all, only partially pressed down into the socket insert to allow rotation of the socket insert 103 between on and off positions. In the blocking position, the locking element 104 is pressed down into the socket insert 103 to such an extent that a rotary displacement of the socket insert between on and off positions is not possible. In the release position, the locking element 104 allows the socket insert 103 to be rotated to its on-position by a suitable plug having a corresponding aperture to receive the projecting portion of the locking element 104, as described above.

Figure 18:
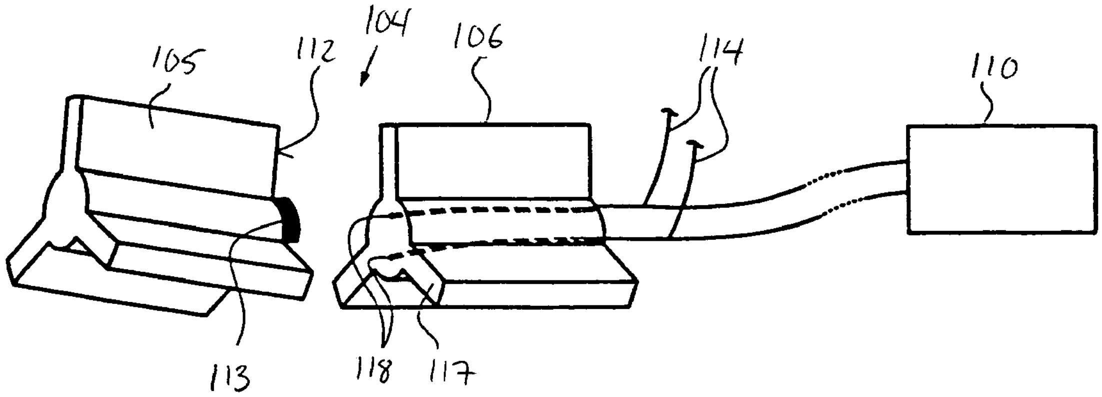
FIG. 18 shows a perspective top view of the locking component and of the blocking component in a simplified representation.

Referring also to FIG. 18, locking element 104 differs from the locking pin 13 described above, in that locking element 104 also allows the socket insert 103 to be rotated by a plug that does not have an aperture that corresponds to the shape of locking element 104. Locking element 104 is composed of a locking component 105 and a blocking component 106, which have the same, essentially threearmed cross-section, at identical angles (other cross-sections are possible). Locking component 105 and blocking component 106 are both received in socket insert 103 such that locking component 105 projects beyond socket insert 103, analogously to locking pin 13 described above. In this way, socket insert 103 can only be rotated by inserting a plug into socket insert 103 that has a coded aperture that corresponds in shape to the locking component 106 in order to receive the locking component 106. Unlike locking pin 13, locking component 105 can be removed from socket insert 103, while leaving blocking component 106 inserted inside socket insert 103. Thus, when locking component 105 is removed, socket insert 103 can be rotated by a plug that does not have an aperture that corresponds to the shape of locking component 104.

Figure 16:
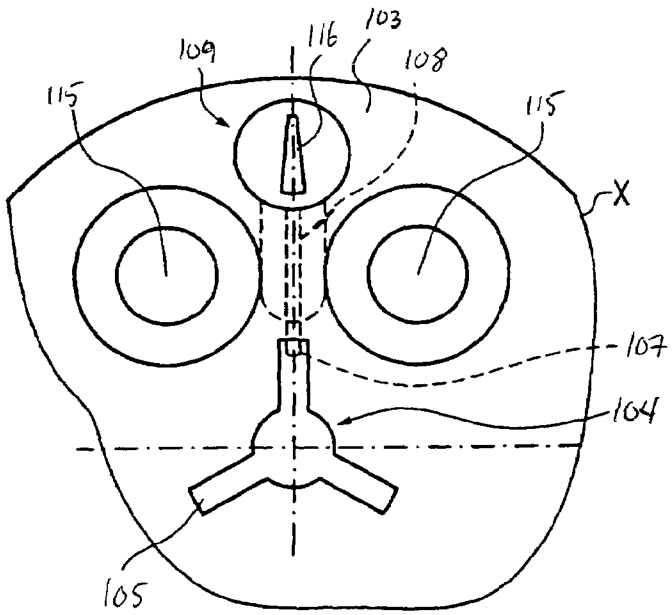
FIG. 16 shows an enlarged representation of a detail "X" of FIG. 15 in the inserted condition of the locking component.
Figure 17:
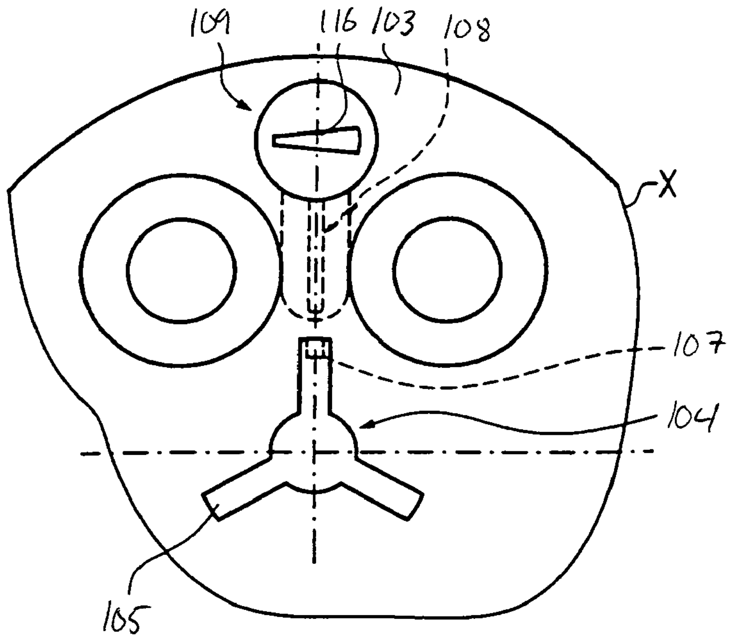
FIG. 17 shows a view analogously to FIG. 16 in the removed condition of the locking component.

FIGS. 16 and 17 show enlarged representations of a detail "X" of FIG. 15. Referring to FIG. 16, when the electrical socket is intended to be used in explosion-prone areas and only with plugs having a corresponding coded aperture, the locking component 105 is inserted and releasably secured in position in the socket insert 103. The releasable fastening results from engagement of a locking pin 108 with a lateral longitudinal slot 107 in the locking component 105. The locking pin 108 is displaceable by a closing cylinder 109 in the socket insert 103. In the position of engagement shown in FIG. 16, the locking component 105 is fastened in the socket insert 103 and supported such that it is displaceable in the socket insert 103.

Referring to FIG. 17, the closing cylinder 109 has been rotated using a key (not shown) inserted in a keyhole 116, in such a way that the locking pin 108 is retracted from the longitudinal slot 107. This has the effect that the locking component 105 is released and can be removed from the socket insert 103, such that the socket insert 103 can be rotated using any type of plug, as described above.

Referring again to FIG. 18, a mechanism is provided to indicate when the locking component 105 has been removed from the socket insert 103. A contact element 113 is arranged on an end 112 of the locking component 105 facing the blocking component 106. This contact element 113 can be implemented in the form of a substantially flat contact plate. When the locking component 105 and the blocking component 106 abut on one another, the contact element 113 serves as a short-circuit element interconnecting free ends 118 of electric lines 114. The free ends 118 of the electric line 114 are arranged in a front end 117 of the blocking component 106, with the front end 117 facing the locking component 105. The electric lines 114 extend not only to the free ends 118 but also to an electric display component 110. On this display component 110, a warning, such as "do not use in explosion-prone areas", can be displayed. When the contact element 113 is not in contact with the free ends 118 (i.e., when the locking component 105 has been removed), the free ends 118 are, accordingly, not short-circuited and power is supplied to the display component 110 for displaying the warning. The electric display component 110 is only turned off if the free ends 118 of the electric lines 114 are short-circuited.

A number of implementations have been described. Nevertheless, it will be understood that various modifications may be made. Accordingly, other implementations are within the scope of the following claims.

What is claimed is:

1. An electrical socket for use in explosion-prone areas, comprising:

a socket insert that is supported in a socket housing such that the socket insert is adapted to be rotated between off- and on-positions; and a substantially pin-shaped locking element supported in the socket insert such that the locking element is displaceable between a pressed-down blocking position and a release position in which the locking element projects beyond the socket insert, the locking element being configured such that the socket insert is rotatable between the off- and on-positions when the locking element is in the release position, wherein the locking element is defined by at least one removable locking component and a blocking component that are arranged on top of one another in the socket insert such that the locking component projects beyond the socket insert when the locking element is in the release position.

2. An electrical socket according to claim 1 wherein the locking component and the blocking component have identical cross-sections.

3. An electrical socket according to claim 2 wherein the locking component is releasably secured in the socket insert.

4. An electrical socket according to claim 3 wherein the locking component is provided with a lateral longitudinal slot that is adapted to be engaged with a locking pin that is displaceably supported in the socket insert.

5. An electrical socket according to claim 4 wherein the locking pin is adapted to be displaced by a closing cylinder arranged in the socket insert.

6. An electrical socket according to claim 5 wherein a warning is visible when the locking component is removed.

7. An electrical socket according to claim 6 wherein the warning is visible on an electrically operated display component.

8. An electrical socket according to claim 7 wherein when the locking component and the blocking component abut on one another, an electric contact is closed and the electric display component is turned off.

9. An electrical socket according to claim 8 wherein the locking component has a contact element on its end facing the blocking component, the contact element interconnecting electric lines provided in or on the blocking component.

10. An electrical socket according to claim 1 wherein the locking component is releasably secured in the socket insert.

11. An electrical socket according to claim 10 wherein the locking component is provided with a lateral longitudinal slot that is adapted to be engaged with a locking pin that is displaceably supported in the socket insert.

12. An electrical socket according to claim 11 wherein the locking pin is adapted to be displaced by a closing cylinder arranged in the socket insert.

13. An electrical socket according to claim 12 wherein a warning is visible when the locking component is removed.

14. An electrical socket according to claim 13 wherein the warning is visible on an electrically operated display component.

15. An electrical socket according to claim 14 wherein when the locking component and the blocking component abut on one another, an electric contact is closed and the electric display component is turned off.

16. An electrical socket according to claim 15 wherein the locking component has a contact element on its end facing the blocking component, the contact element interconnecting electric lines provided in or on the blocking component.

* * * * *